United States Patent
Wear et al.

(10) Patent No.: US 7,145,986 B2
(45) Date of Patent: Dec. 5, 2006

(54) SOLID STATE X-RAY DETECTOR WITH IMPROVED SPATIAL RESOLUTION

(75) Inventors: James A. Wear, Madison, WI (US); Robert A. Washenko, Madison, WI (US)

(73) Assignee: General Electric Company, Schenectady, NY (US)

( * ) Notice: Subject to any disclaimer, the term of this patent is extended or adjusted under 35 U.S.C. 154(b) by 164 days.

(21) Appl. No.: 10/838,893

(22) Filed: May 4, 2004

(65) Prior Publication Data

US 2005/0249331 A1     Nov. 10, 2005

(51) Int. Cl.
  *H05G 1/64*   (2006.01)
  *G01N 23/087*   (2006.01)
  *G01T 1/24*   (2006.01)

(52) U.S. Cl. ............ 378/98.8; 378/53; 378/98.9; 250/370.09; 250/370.13

(58) Field of Classification Search ............ 378/19, 378/98.8; 250/363.1, 370.09, 370.1, 370.11, 250/370.12, 370.13
See application file for complete search history.

(56) References Cited

U.S. PATENT DOCUMENTS

| | | | | |
|---|---|---|---|---|
| 5,229,597 | A | * | 7/1993 | Fukatsu ............ 250/208.2 |
| 5,677,539 | A | * | 10/1997 | Apotovsky et al. .... 250/370.13 |
| 5,821,539 | A | * | 10/1998 | Matz et al. ............ 250/370.01 |
| 5,841,832 | A |   | 11/1998 | Mazess et al. |
| 5,841,833 | A |   | 11/1998 | Mazess et al. |
| 5,905,264 | A | * | 5/1999 | Shahar et al. ........ 250/370.01 |
| 6,028,313 | A | * | 2/2000 | McDaniel ............ 250/370.09 |
| 6,034,373 | A | * | 3/2000 | Shahar et al. ........ 250/370.01 |
| 6,037,595 | A |   | 3/2000 | Lingren |
| 6,072,181 | A | * | 6/2000 | Hassard et al. ....... 250/370.01 |
| 6,201,247 | B1 | * | 3/2001 | Lutheran et al. ...... 250/363.04 |
| 6,272,207 | B1 | * | 8/2001 | Tang ............ 378/149 |
| 6,298,113 | B1 | * | 10/2001 | Duclos et al. ............ 378/19 |
| 6,459,086 | B1 | * | 10/2002 | Kline et al. ........ 250/370.13 |
| 6,586,742 | B1 | * | 7/2003 | Danielsson ............ 250/370.01 |
| 6,696,686 | B1 | * | 2/2004 | Wainer et al. ........ 250/363.1 |
| 6,765,213 | B1 | * | 7/2004 | Shahar et al. ........ 250/370.09 |

* cited by examiner

*Primary Examiner*—Allen C. Ho
(74) *Attorney, Agent, or Firm*—Quarles & Brady LLP

(57) ABSTRACT

A monolithic detector uses a grid to block x-rays from inter-pixel regions such as are believed to cause electrical noise in the pixel signals.

27 Claims, 2 Drawing Sheets

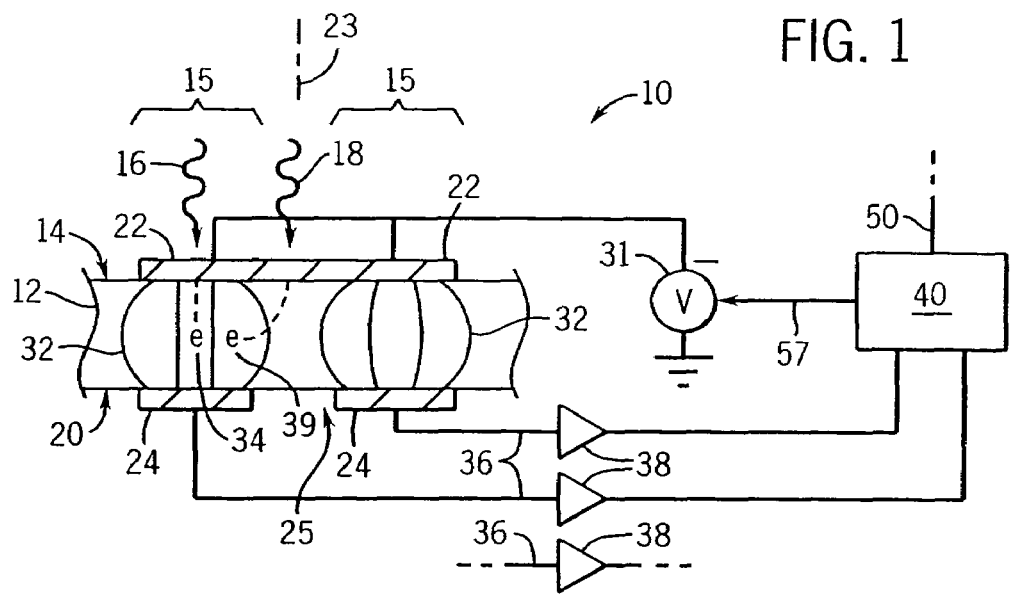

SOLID STATE X-RAY DETECTOR WITH IMPROVED SPATIAL RESOLUTION

CROSS-REFERENCE TO RELATED APPLICATIONS

STATEMENT REGARDING FEDERALLY SPONSORED RESEARCH OR DEVELOPMENT

BACKGROUND OF THE INVENTION

The present invention relates generally to x-ray detectors, and in particular, to a cadmium zinc telluride (CZT) detector used for quantitative x-ray imaging.

Measurements of the x-ray absorption by an object at two different x-ray energies can reveal information about the composition of that object as decomposed into two selected basis materials. In the medical area, the selected basis materials are frequently bone and soft tissue. The ability to distinguish bone from surrounding soft tissue allows x-ray images to yield quantitative information about in vivo bone density for the diagnosis of osteoporosis and other bone disease.

Selecting different selected basis materials allows dual energy x-ray measurements to be used for other purposes. For example, dual energy x-ray measurements can be used for the analysis of body composition by distinguishing between fat and lean tissue, or for baggage scanning by distinguishing between explosive and non-explosive materials.

Cadmium zinc telluride (CZT) detectors may be used to measure x-rays passing through a measured object in dual energy x-ray systems. Such CZT detectors release an electrical charge for each incident photon proportional to the photon energy and thus allow separate measurement of high and low energy x-rays as sorted by pulse height.

Generally, a CZT detector employs a number of separate crystals of CZT, each having a front and rear surface electrode to detect x-rays within a pixel defined by the area of the crystal. Constructing a CZT detector requires the assembly of many separate CZT crystals which can be difficult. High-resolution detectors having smaller pixel sizes require smaller crystals, exacerbating the problem of assembly.

SUMMARY OF THE INVENTION

The present invention provides a high resolution CZT detector constructed of a monolithic crystal of CZT having multiple electrodes placed on one face to define multiple pixels. The monolithic design eliminates the assembly problems caused by the use of many separate crystals but normally does not provide the signal quality associated with separate crystal designs.

While the present inventors do not wish to be bound to a particular theory, they believe that this loss of signal quality is caused by x-rays striking between the electrode defined pixels (in "gutter regions") which liberates charge carriers that then migrate unpredictably into adjacent pixels corrupting the measurements at those pixels.

For this reason, the present invention provides for an x-ray blocking mask to cover the gutter regions.

These particular features, objects and advantages may apply to only some embodiments falling within the claims and thus do not define the scope of the invention.

BRIEF DESCRIPTION OF THE DRAWINGS

FIG. 1 is a cross-sectional view of a monolithic CZT detector according to the present invention but without a mask covering the gutter regions, and thus showing charge carrier migration from the gutter regions into adjacent pixel regions. FIG. 1 also shows the detection circuitry used for initialization of the bias on the monolithic detector and for interpolation within the defined pixels;

FIG. 2 is a figure similar to that of FIG. 1 showing positioning of a mask over the detector to block x-rays from striking the gutter region;

FIG. 3 is a top planar view of the rear surface of a monolithic CZT detector showing the placement of the steering electrodes in a grid pattern and showing the location of the anodes in a staggered parallelogram configuration for improved sampling in a scanning x-ray machine;

DETAILED DESCRIPTION OF THE PREFERRED EMBODIMENT

Figure 4:
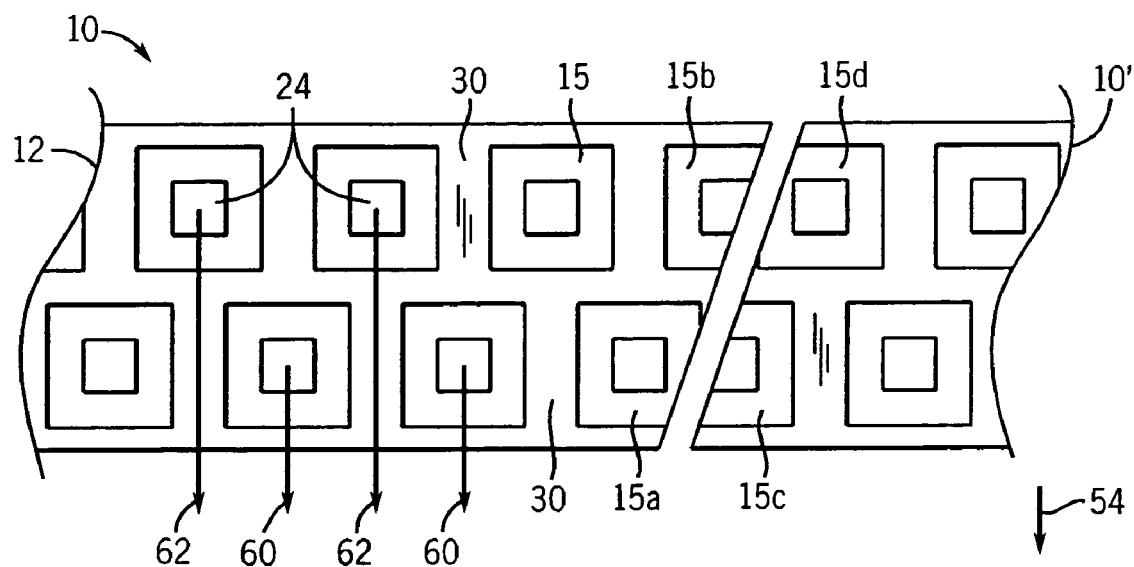
FIG. 4 is a figure similar to that of FIG. 2 showing an alternative staggered configuration of electrodes using rectangular detector elements.

Referring now to FIG. 1, a solid-state, dual energy x-ray detector system 10 may include a monolithic CZT crystal 12 having a front surface 14 normally facing a source of x-ray photons 16 and 18 and a rear surface 20 on the opposite side of the CZT crystal from the front surface. Other materials such as CdTe and $HgI_2$ may alternatively be used.

A cathode 22 is applied to the front surface 14 of the CZT crystal 12, and an anode 24 is applied to the rear surface 20 of the CZT crystal 12 to provide a biasing electrical field between them. Generally, the cathode 22 will cover the entire front surface 14 but the anode will cover only a small area centered on the rear surface 20. Both the cathode 22 and anode 24 may be applied directly to the CZT crystal 12, for example, by sputtering, and are preferably formed of a conductive metal such as platinum. The front surface 14 of the CZT crystal 12 may also be protected by a light, opaque, x-ray transparent material such as aluminized Mylar. Mylar is a registered trademark of E.I. Du Pont De Nemours and Company Corporation of Wilmingtion Del.

The anodes 24 are separated by a gutter region 25. In one embodiment of the invention, the anodes 24 are approximately 1.5 by 2.5 millimeters in area and the gutter regions 25 are approximately 150–200 microns wide. The gutter regions 25 serve to electrically isolate the anodes 24 to permit independent measurement of bursts of charge released between the cathode 22 on front surface 14 and the anodes 24 on the rear surface 20 along axis 23 for each pixel region 15. Weak electric fields in this inter-pixel (gutter) region are responsible for inefficient charge collection. Although the preferred embodiment may use steering electrodes (not shown), there is always a region (typically 0.1–0.2 mm) in which charge is split between two pixels, due to the finite width of charge deposition created by x-ray absorption.

To promote efficient collection of charge deposited in the crystal 12, a bias voltage controlled via input 57 to bias voltage source 31 is applied across the opposed cathode 22 and anodes 24 of each pixel region 15 producing an electrical field 32. X-ray photons 16 passing through cathode 22 on the front surface 14 enter the monolithic crystal 12 to liberate charge carriers 34 (shown here as electrons) which are then collected by anodes 24 on the rear surface 20 and conducted via separate leads 36 for each pixel region 15 to a ground referenced charge integrator 38. The amount of charge liberated by each photon 16 is indicative of the energy of the x-ray photon 16. Outputs from the charge integrators 38 are received by one or more processing computers 40 connected via network 50 that may produce a quantitative image of the x-ray photons 16 according to techniques well known in the art.

In contrast to x-ray photons 16 striking within the pixel regions 15, x-ray photons 18 passing into the monolithic crystal 12 at gutter region 25 will produce charge carriers 39, that may migrate into a pixel region 15 to be collected by anode 24 on the rear surface 20. These charge carriers 39 degrade the quantitative accuracy and spatial resolution of a monolithically designed detector system 10, adding an effective noise component to the charge collected from x-ray photons 16.

Referring now to FIG. 2, the present invention reduces the effect of charge carriers 39 by providing a tungsten mask 44 having mullions 45 covering the gutter regions 25 on the front surface 14 of the CZT crystal 12. The mullions 45 may have a width of approximately 300 microns to overlap slightly the 150–200 micron gutter region 25 while minimizing interference with x-ray photons 16. The tungsten mask 44 may be electrically isolated from the cathode 22 on the front surface 14 of the monolithic crystal 12 by a thin film 42, for example a Mylar film, which provides substantially no x-ray attenuation.

It will be recognized that other x-ray attenuating materials may be used for the mask 44 other than tungsten. However, the tungsten is readily machined via laser cutting to the appropriate grid size. Registration points may be placed on the front surface 14 to allow the registration of the mask 44 with the gutter regions 25 during manufacture.

Referring now also to FIG. 3, generally the x-ray detector system 10 may provide for multiple detector elements on a single CZT crystal 12. In this case, multiple anodes 24 will be placed on the CZT crystal 12, each surrounded by steering electrodes 30, may be interconnected and covered by a single cathode 22. Multiple anode contacts 28 are placed on the CZT crystal 12.

The steering electrodes 30 surrounding each anode 24 (and equal area anode contact 28) describe by their perimeter a pixel region 15 associated with each anode contact 28. The steering electrodes are not necessary to the design and pixels regions may be defined by the combination of mask and shape of electric field between anode and cathode with or without steering grid. The pixel regions 15 describe areas which may independently detect x-ray photons 16 to produce a quantitative detection value that will be mapped to individual pixels in a resultant image.

In the embodiment shown in FIG. 3, the pixel regions 15 are generally parallelograms tiling in rows and slanted columns. In this embodiment, each parallelogram pixel region 15 has a first base 52 generally perpendicular to a scan direction 54 in which the x-ray detector system 10 will be scanned to collect information over an area of the patient. Sidewalls 56 of the parallelogram and the pixel regions 15 are angled such that the centers of the pixel regions 15 defined approximately by the center of the anode contact 28 for a first row of pixel regions 15, follow paths 60 that interleave with paths 62 followed by centers of the pixel regions 15 of a second row of pixel regions 15. In this way, larger pixel regions 15 may provide higher spatial resolution sampling to improve the resultant image. Further the data lost from mask covered gutter areas in one row is regained in the next staggered row.

Referring now to FIG. 4, in an alternative embodiment, the pixel regions 15 may be rectangular with the pixel regions 15 of a first row staggered with respect to the second row to provide interleaved paths 60 and 62 as before. The rectangular pixel regions 15 of FIG. 3 provide the advantage of a more compact detection region limiting the effective size of a convolution kernel (a function of the project width of the pixel regions 15 on a line perpendicular to the scan direction 54) that can make a resultant image less distinct.

Referring still to FIG. 4, a convenient form factor for the x-ray detector system 10 has two rows each having eight pixel regions 15. Multiple detector systems 10 of this or similar form factors may be ganged edgewise to provide arbitrary continuations of the rows. For an x-ray detector system 10 having rectangular pixel regions 15, pixel regions 15a and 15b at a first and second row of a right edge of the x-ray detector system 10 may be cut at an angle with respect to the scan direction 54 to equally reduce the area of the pixel regions 15a and 15b. Similarly reduced pixel regions 15c and 15d at a first and second row of a left edge of a next x-ray detector system 10' may be placed in close proximity to their counterpart pixel regions 15b and 15a. The area of each pixel region 15a–15d is reduced by half the width of the joint gap between x-ray detector system 10 and 10', which then preserves the regular lateral of the other pixel regions 15. In another embodiment, the area of each pixel region 15a–15d is reduced to slightly less than half to accommodate the joint gap between x-ray detector system 10 and 10'. This provides two virtual pixel regions, the first being a combination of the signals from pixel regions 15a and 15d, and the second being a combination of the pixel regions 15b and 15c. The slightly reduced detection area of these detectors virtual pixel regions may be corrected mathematically by a weighting factor applied by the computer receiving the signals.

Figure 5:
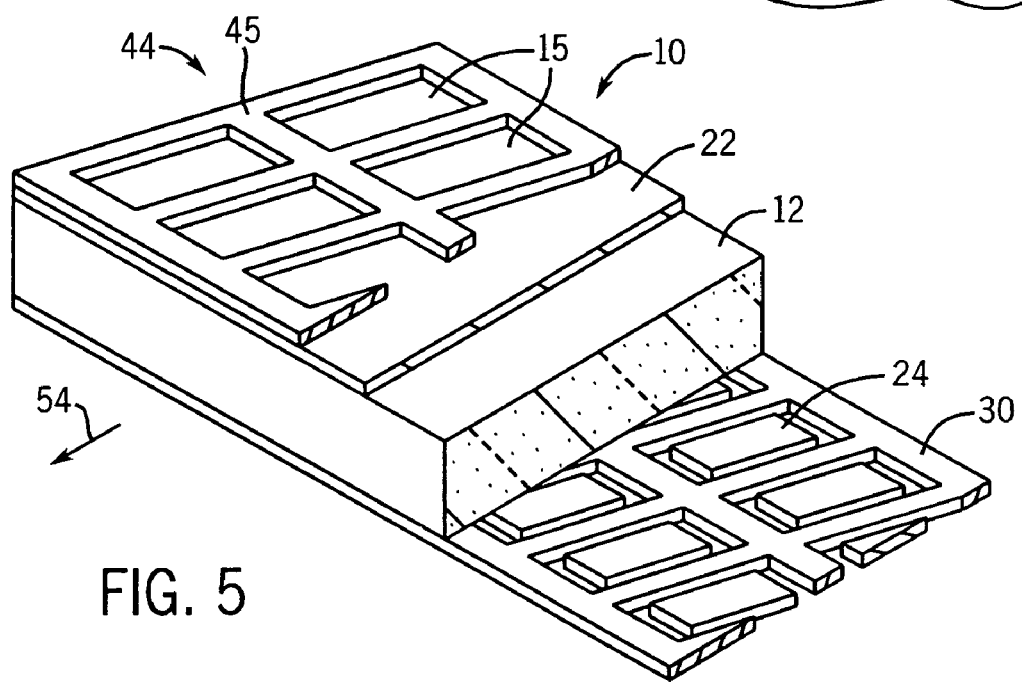
FIG. 5 is a plan view of the detector of FIGS. 1 and 2 showing staggered column configuration of the detector elements.

Referring now to FIG. 5 the a mask 44 for either of the embodiments of FIGS. 3 and 4 will generally match the pattern of the steering electrodes 30 and will sit above, and insulated from the cathode 22 followed by the CZT crystal 12 and then the patterns of the anodes 24 and steering electrodes 30

Figure 6:
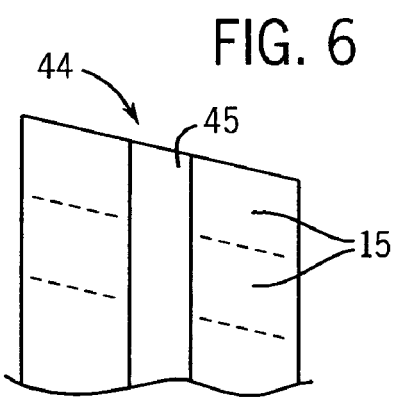
FIG. 6 is a figure similar to FIG. 3 showing an alternative embodiment in which a single dividing mullion is used to define detector element areas.

Referring to FIG. 6, in an alternative embodiment, the mask 44 composed of a single mullion 45 passing along the central axis of the detector system 10 may be used or strips only at interfaces between pixel regions 15.

The present invention is applicable not only to polygonal electrode regions, but other shapes as well.

It is specifically intended that the present invention not be limited to the embodiments and illustrations contained herein, but include modified forms of those embodiments including portions of the embodiments and combinations of elements of different embodiments as come within the scope of the following claims.

The invention claimed is:

1. A solid state x-ray detector comprising:
   a monolithic x-ray detecting element having a front and rear surface;
   at least one electrode attached to the front surface of the monolithic x-ray detecting element;
   a plurality of electrodes attached to the rear surface of the monolithic x-ray detecting element and electrically separated by gutter regions, wherein the electrodes define areas corresponding to pixels in a reconstructed image and the gutter regions define areas where charge carriers are able to migrate unpredictably toward one of a variety of areas corresponding to one of a variety of pixels in the reconstructed image; and an x-ray blocking mask attached to the front surface of the monolithic x-ray detecting element and having openings arranged opposite the plurality of electrodes on the rear surface and blocking elements arranged over the gutter regions to substantially block x-rays directed toward the front surface of the monolithic x-ray detecting element from entering an area on the front surface of the monolithic x-ray detecting element opposite the gutter regions.

2. The solid-state x-ray detector of claim 1 wherein the blocking elements are positioned and sized with respect to an x-ray source to cast an x-ray shadow substantially covering the entire gutter region.

3. The solid-state x-ray detector of claim 1 wherein the monolithic detecting element is selected from the group consisting of: CZT, CdTe, and $HgI_2$.

4. The solid-state x-ray detector of claim 1 wherein the blocking mask is wider than the gutter regions to block x-rays from entering the area on the front surface of the monolithic x-ray detecting element opposite the gutter regions and an area on the front surface of the monolithic x-ray detecting element opposite an area flanking the gutter regions.

5. The solid state x-ray detector of claim 1 including an insulating layer positioned between the front surface of the monolithic x-ray detecting element and the x-ray blocking mask.

6. The solid-state x-ray detector of claim 5 wherein the insulating layer is configured to electrically isolate the at least one electrode from the x-ray blocking mask and provide substantially no x-ray attenuation.

7. The solid-state x-ray detector of claim 1 wherein the x-ray blocking mask includes tungsten.

8. The solid-state x-ray detector of claim 1 further including a readout circuit reading independent currents from each of the plurality of electrodes attached to the rear surface of the monolithic x-ray detecting element.

9. The solid-state x-ray detector of claim 1 wherein the plurality of electrodes attached to the rear surface of the monolithic x-ray detecting element are arranged in rectilinear columns and rows, and the blocking mask is a rectilinear grid.

10. The solid state x-ray detector of claim 1 wherein the plurality of electrodes attached to the rear surface of the monolithic x-ray detecting element are arranged in linear rows staggered along the rows by a fraction of a row width, and the blocking mask is a staggered grid having blocking elements following interfaces between the electrodes.

11. The solid state x-ray detector of claim 1 wherein the plurality of electrodes attached to the rear surface of the monolithic x-ray detecting element are arranged in linear rows staggered along the rows by a fraction of a row width and the blocking mask is strip positioned along an interface between rows.

12. The solid-state x-ray detector of claim 1 further comprising at least one steering electrode surrounding each of the plurality of electrodes attached to the rear surface of the monolithic element.

13. A quantitative bone densitometry machine comprising:

an x-ray source providing at least two energies of x-rays;

a solid-state x-ray detector arranged opposite the x-ray source and having:
1) a monolithic element having a front surface and rear surface;
2) at least one electrode attached to the front surface of the monolithic element;
3) a plurality of electrodes attached to the rear surface of the monolithic element and electrically separated from one another by areas forming gutter regions; and
4) an x-ray blocking mask attached to the front surface of the monolithic element and having a respective plurality of openings, each opening arranged on the front surface of the monolithic element opposite a corresponding electrodes on the rear surface of the monolithic element, and having blocking elements arranged on the front surface of the monolithic element opposite the areas separating the plurality of electrodes from one another forming gutter regions to substantially block x-rays traveling a path leading to an area on the front surface of the monolithic element opposite the areas separating the plurality of electrodes from one another forming gutter regions; and measuring circuitry communicating with each of the plurality of electrodes to receive an electrical signal indicative of x-ray detection events and calculate a bone density measurement from the electrical signal by distinguishing the portions of the electrical signal corresponding to each of two energies of x-rays.

14. The quantitative bone densitometry machine of claim 13 wherein the blocking elements are positioned and sized with respect to an x-ray source to cast an x-ray shadow substantially covering the entire gutter region.

15. The quantitative bone densitometry machine of claim 13 wherein the monolithic element is selected from the group consisting of: CZT, CdTe, and $HgI_2$.

16. The quantitative bone densitometry machine of claim 13 wherein the blocking mask is wider than the gutter regions to block x-rays from entering the area on the front surface of the monolithic x-ray detecting element opposite the gutter regions and an area on the front surface of the monolithic x-ray detecting element opposite an area flanking the gutter regions.

17. The quantitative bone densitometry machine of claim 13 including an insulating layer positioned between the monolithic element and the x-ray blocking mask.

18. The quantitative bone densitometry machine of claim 17 wherein the insulating layer is configured to electrically isolate the at least one electrode from the x-ray blocking mask and provide substantially no x-ray attenuation.

19. The quantitative bone densitometry machine of claim 13 wherein the x-ray blocking mask includes tungsten.

20. The quantitative bone densitometry machine of claim 13 further including a readout circuit reading independent currents from each of the plurality of electrodes attached to the rear surface of the monolithic element.

21. The quantitative bone densitometry machine of claim 13 wherein the plurality of electrodes attached to the rear surface of the monolithic element are arranged in rectilinear columns and rows, and the blocking mask is a rectilinear grid.

22. The quantitative bone densitometry machine of claim 13 wherein the plurality of electrodes attached to the rear surface of the monolithic element are arranged in linear rows staggered along the rows by a fraction of a row width, and the blocking mask is a staggered grid having blocking elements following an interface between the electrodes.

23. The quantitative bone densitometry machine of claim 13 wherein the plurality of electrodes attached to the rear surface of the monolithic element are arranged in linear rows staggered along the rows by a fraction of a row width and the blocking mask is a strip positioned along an interface between rows.

24. A solid-state x-ray detector comprising:
a monolithic x-ray detecting element having a front surface and rear surface;
at least one electrode positioned on the front surface of the monolithic x-ray detecting element;
a plurality of electrodes positioned on the rear surface of the monolithic x-ray detecting element;
a plurality of gutters electrically separating each of the plurality of electrodes positioned on the rear surface of the monolithic x-ray detecting element; and
an x-ray blocking mask arranged on the front surface of the monolithic x-ray detecting element and having blocking elements arranged opposite the gutters to substantially block x-rays traveling a path that would cause the x-rays to intersect the front surface of the monolithic x-ray detecting element in the area opposite the plurality of gutters, and wherein the blocking elements are separated by openings arranged on the front surface of the monolithic x-ray detecting element to form passages leading directly through the monolithic x-ray detecting element to the plurality of electrodes positioned on the rear surface of the monolithic x-ray detecting element.

25. The solid-state x-ray detector of claim 24 wherein at least one electrode positioned on the front surface is arranged between the x-ray blocking mask and the front surface of the monolithic x-ray detecting element.

26. The solid-state x-ray detector of claim 24 further comprising an insulating layer positioned between the monolithic x-ray detecting element and the x-ray blocking mask.

27. The solid-state x-ray detector of claim 24 further comprising at least one steering electrode surrounding each of the plurality of electrodes positioned on the rear surface of the monolithic x-ray detecting element.

* * * * *

UNITED STATES PATENT AND TRADEMARK OFFICE
CERTIFICATE OF CORRECTION

| | |
|---|---|
| PATENT NO. | : 7,145,986 B1 |
| APPLICATION NO. | : 10/838893 |
| DATED | : December 5, 2006 |
| INVENTOR(S) | : Wear et al. |

It is certified that error appears in the above-identified patent and that said Letters Patent is hereby corrected as shown below:

Col. 6, Claim 13, line 15, "corresponding electrodes" should be --corresponding electrode--

Signed and Sealed this

Thirteenth Day of February, 2007

JON W. DUDAS
*Director of the United States Patent and Trademark Office*